(12) United States Patent
Uetake et al.

(10) Patent No.: US 6,388,442 B1
(45) Date of Patent: May 14, 2002

(54) MAGNETIC RESONANCE SIGNAL ACQUIRING METHOD AND APPARATUS, RECORDING MEDIUM AND MAGNETIC RESONANCE IMAGING APPARATUS

(75) Inventors: Nozomu Uetake; Susumu Kosugi, both of Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/897,537

(22) Filed: Jul. 2, 2001

(30) Foreign Application Priority Data

Sep. 26, 2000 (JP) ........................................ 2000-291535

(51) Int. Cl.[7] ................................................ G01V 3/00
(52) U.S. Cl. ........................ 324/309; 324/307; 324/300
(58) Field of Search ................................. 324/309, 307, 324/312, 314, 300; 128/653.1; 600/410

(56) References Cited

U.S. PATENT DOCUMENTS

| | | | | |
|---|---|---|---|---|
| 5,212,448 A | * | 5/1993 | Le Roux et al. | 324/309 |
| 5,327,086 A | * | 7/1994 | Bodenhausen et al. | 324/309 |
| 5,627,468 A | * | 5/1997 | Kojima et al. | 324/307 |

* cited by examiner

Primary Examiner—Edward Lefkowitz
Assistant Examiner—Brij B. Shrivastav
(74) Attorney, Agent, or Firm—Moonray Kojima

(57) ABSTRACT

For the purpose of increasing the time available for performing a calculation on a navigator echo, a method comprises: during one of two consecutive periods TR, effecting RF excitation on spins within an object and acquiring a navigator echo, and thereafter effecting RF excitation for preparation; and during the other of the two consecutive periods, effecting RF excitation on the spins within the object and acquiring an imaging echo, and thereafter effecting RF excitation for preparation.

20 Claims, 6 Drawing Sheets

MAGNETIC RESONANCE SIGNAL ACQUIRING METHOD AND APPARATUS, RECORDING MEDIUM AND MAGNETIC RESONANCE IMAGING APPARATUS

BACKGROUND OF THE INVENTION

The present invention relates to a magnetic resonance signal acquiring method and apparatus, a recording medium and a magnetic resonance imaging apparatus, and more particularly to a magnetic resonance signal acquiring method and apparatus for effecting RF (radio frequency) excitation for preparation on spins within an object, followed by effecting RF excitation again and acquiring a navigator echo, and effecting RF excitation for preparation on the spins within the object, followed by effecting RF excitation again and acquiring an imaging echo, a recording medium recorded with a program for causing a computer to perform such a magnetic resonance signal acquiring function, and a magnetic resonance imaging apparatus comprising such magnetic resonance signal acquiring means.

In a magnetic resonance imaging (MRI) apparatus, an object to be imaged is carried into an internal space of a magnet system, i.e., a space in which a static magnetic field is generated; a gradient magnetic field and a high frequency magnetic field are applied to generate magnetic resonance signals from spins within the object; and a tomographic image is constructed based on the received signals. The magnetic resonance signal for use in constructing the tomographic image is sometimes referred to as an imaging echo.

Since the spin frequency is proportional to the magnetic field strength, the spin frequency varies as the static magnetic field strength varies. If the temporal variation in the spin frequency is considerably large, the current value of the spin frequency is determined before effecting RF excitation for generating an imaging echo, and the RF excitation for generating the imaging echo is effected by the high frequency magnetic field having a frequency equal to the current value of the spin frequency.

In order to evaluate the current value of the spin frequency, the spins are RF-excited separately to measure an FID (free induction decay) signal. The FID is sometimes referred to as a navigator echo. The spin frequency is determined from the navigator echo by a calculation.

Before effecting the RF excitation for the imaging echo, RF excitation for bringing the state of spins within the object to a predetermined state may be effected. Such RF excitation is sometimes referred to as preparation. The RF excitation signal for the preparation is sometimes referred to as a preparation pulse.

The preparation includes, for example, spatial pre-saturation for saturating spins in a desired region within the object, and chemical saturation for saturating spins contained in a particular molecular structure.

Moreover, magnetization transfer for reducing the signal strength from tissues having a high protein concentration, and inversion for inverting spins in order to perform imaging according to an IR (inversion recovery) technique are also included in the category of preparation. Preparation is performed also in acquiring the navigator echo.

FIG. 1 is a time chart of navigator echo collection accompanied by preparation, a calculation on the navigator echo and imaging echo collection accompanied by preparation. The timing of gradient magnetic field application is omitted in the drawing.

As shown, the navigator echo collection accompanied by preparation and the imaging echo collection accompanied by preparation are separately performed during two consecutive periods. The length of each period is TR (repetition time).

In the earlier period, a preparation pulse such as, for example, a spatial pre-saturation pulse is applied at a time t1. Next, at a time t2, RF excitation is effected for generating a navigator echo. Next, from a time t3 to a time t4, navigator echo collection is performed.

Next, from a time t5 to a time t6, a calculation is performed based on the collected echo data. The spin frequency is determined by the calculation. The result of the calculation is reflected on the frequency of the RF excitation in the later period.

In the later period, a preparation pulse such as, for example, a spatial pre-saturation pulse is applied at a time t7. The frequency of the preparation pulse is made equal to the spin frequency determined by the calculation in the earlier period.

Next, at a time t8, RF excitation is effected for generating an imaging echo. The frequency of the RF excitation is made equal to the spin frequency determined by the calculation in the earlier period. Next, from a time t9 to a time t10, imaging echo collection is performed.

By repeating the above operation, imaging echoes for a plurality of views are sequentially collected. Each of the imaging echoes is given different phase encoding for each view by the gradient magnetic field, which is omitted in the drawing.

In the above operation, the calculation on the navigator echo should be completed within an interval after the navigator echo collection up to the beginning of the next period. However, this interval is short because it is the remainder of the period TR after subtraction of the time required for the preparation, RF excitation and navigator echo collection, and the time available for performing the calculation is insufficient. Accordingly, the calculation must be sped up to complete the calculation within the interval, or, if this is not possible, the period TR must be extended.

SUMMARY OF THE INVENTION

Therefore, it is an object of the present invention to provide a magnetic resonance signal acquiring method and apparatus in which the time available for a calculation on a navigator echo is large, and a recording medium recorded with a program for causing a computer to perform such a magnetic resonance signal acquiring function, and a magnetic resonance imaging apparatus comprising such magnetic resonance signal acquiring means.

(1) The present invention, in accordance with one aspect for solving the aforementioned problem, is a magnetic resonance signal acquiring method that executes the steps of effecting RF excitation for preparation on spins within an object, followed by effecting RF excitation again and acquiring a navigator echo; effecting RF excitation for preparation on the spins within the object, followed by effecting RF excitation again and acquiring an imaging echo; and performing a calculation on said acquired navigator echo to adjust the frequency of said RF excitation based on the result of the calculation, which method is characterized in comprising: effecting the RF excitation on the spins within the object and acquiring the navigator echo, and thereafter effecting the RF excitation for preparation during one of two consecutive periods; and effecting the RF excitation on the spins within the object and acquiring the imaging echo, and thereafter effecting the RF excitation for preparation during the other of the two consecutive periods.

In this aspect of the invention, since the RF excitation is effected on spins within an object and the navigator echo is acquired and thereafter the RF excitation for preparation is effected during one of two consecutive periods, and the RF excitation is effected on the spins within the object and the imaging echo is acquired and thereafter the RF excitation for preparation is effected during the other of the two consecutive periods, the interval from the navigator echo acquisition to the beginning of the next period is long, and the time available for the calculation on the navigator echo is long.

(2) The present invention, in accordance with another aspect for solving the aforementioned problem, is the magnetic resonance signal acquiring method as described regarding (1), characterized in that said preparation is spatial pre-saturation.

In the invention of this aspect, since the RF excitation is effected on spins within an object and the navigator echo is acquired and thereafter the RF excitation for spatial pre-saturation is effected during one of two consecutive periods, and the RF excitation is effected on the spins within the object and the imaging echo is acquired and thereafter the RF excitation for spatial pre-saturation is effected during the other of the two consecutive periods, the interval from the navigator echo acquisition to the beginning of the next period is long, and the time available for the calculation on the navigator echo is long.

(3) The present invention, in accordance with still another aspect for solving the aforementioned problem, is the magnetic resonance signal acquiring method as described regarding (1), characterized in that said preparation is chemical saturation.

In the invention of this aspect, since the RF excitation is effected on spins within an object and the navigator echo is acquired and thereafter the RF excitation for chemical saturation is effected during one of two consecutive periods, and the RF excitation is effected on the spins within the object and the imaging echo is acquired and thereafter the RF excitation for chemical saturation is effected during the other of the two consecutive periods, the interval from the navigator echo acquisition to the beginning of the next period is long, and the time available for the calculation on the navigator echo is long.

(4) The present invention, in accordance with still another aspect for solving the aforementioned problem, is the magnetic resonance signal acquiring method as described regarding (1), characterized in that said preparation is magnetization transfer.

In the invention of this aspect, since the RF excitation is effected on spins within an object and the navigator echo is acquired and thereafter the RF excitation for magnetization transfer is effected during one of two consecutive periods, and the RF excitation is effected on the spins within the object and the imaging echo is acquired and thereafter the RF excitation for magnetization transfer is effected during the other of the two consecutive periods, the interval from the navigator echo acquisition to the beginning of the next period is long, and the time available for the calculation on the navigator echo is long.

(5) The present invention, in accordance with still another aspect for solving the aforementioned problem, is the magnetic resonance signal acquiring method as described regarding (1), characterized in that said preparation is inversion.

In the invention of this aspect, since the RF excitation is effected on spins within an object and the navigator echo is acquired and thereafter the RF excitation for inversion is effected during one of two consecutive periods, and the RF excitation is effected on the spins within the object and the imaging echo is acquired and thereafter the RF excitation for inversion is effected during the other of the two consecutive periods, the interval from the navigator echo acquisition to the beginning of the next period is long, and the time available for the calculation on the navigator echo is long.

(6) The present invention, in accordance with still another aspect for solving the aforementioned problem, is a magnetic resonance signal acquiring apparatus for acquiring magnetic resonance signals from an object using a static magnetic field, a gradient magnetic field and a high frequency magnetic field, characterized in that the apparatus comprises: preparation means for effecting RF excitation for preparation on spins within an object; echo acquiring means for effecting RF excitation on the spins within the object and acquiring a navigator echo, and for effecting RF excitation on the spins within the object and acquiring an imaging echo; calculating means for performing a calculation on said acquired navigator echo; frequency adjusting means for adjusting the frequency of said RF excitation based on the result of said calculation; and control means for controlling said echo acquiring means to perform the navigator echo acquisition, and thereafter controlling said preparation means to effect the RF excitation for preparation during one of two consecutive periods, and for controlling said echo acquiring means to perform the imaging echo acquisition, and thereafter controlling said preparation means to effect the RF excitation for preparation during the other of the two consecutive periods.

In the invention of this aspect, since the RF excitation is effected on spins within an object and the navigator echo is acquired and thereafter the RF excitation for preparation is effected during one of two consecutive periods, and the RF excitation is effected on the spins within the object and the imaging echo is acquired and thereafter the RF excitation for preparation is effected during the other of the two consecutive periods, the interval from the navigator echo acquisition to the beginning of the next period is long, and the time available for the calculation on the navigator echo is long.

(7) The present invention, in accordance with still another aspect for solving the aforementioned problem, is a recording medium recorded in a computer-readable manner with a program for causing a computer to execute the functions of effecting RF excitation for preparation on spins within an object, followed by effecting RF excitation again and acquiring a navigator echo; effecting RF excitation for preparation on the spins within the object, followed by effecting RF excitation again and acquiring an imaging echo; and performing a calculation on said acquired navigator echo to adjust the frequency of said RF excitation based on the result of the calculation, which recording medium is characterized in that the program causes the computer to effect the RF excitation on the spins within the object and acquire the navigator echo, and thereafter effect the RF excitation for preparation during one of two consecutive periods; and effect the RF excitation on the spins within the object and acquire the imaging echo, and thereafter effect the RF excitation for preparation during the other of the two consecutive periods.

In the invention of this aspect, since a program recorded on the recording medium causes a computer to perform functions of effecting the RF excitation on spins within an object and acquiring the navigator echo and thereafter effecting the RF excitation for preparation during one of two consecutive periods, and effecting the RF excitation on the spins within the object and acquiring the imaging echo and thereafter effecting the RF excitation for preparation during the other of the two consecutive periods, the interval from the navigator echo acquisition to the beginning of the next period is long, and the time available for the calculation on the navigator echo is long.

(8) The present invention, in accordance with still another aspect for solving the aforementioned problem, is a magnetic resonance imaging apparatus for acquiring magnetic resonance signals from an object using a static magnetic field, a gradient magnetic field and a high frequency magnetic field, and constructing an image based on said acquired magnetic resonance signals, characterized in that means for acquiring said magnetic resonance signals comprises: preparation means for effecting RF excitation for preparation on spins within an object; echo acquiring means for effecting RF excitation on the spins within the object and acquiring a navigator echo, and for effecting RF excitation on the spins within the object and acquiring an imaging echo; calculating means for performing a calculation on said acquired navigator echo; frequency adjusting means for adjusting the frequency of said RF excitation based on the result of said calculation; and control means for controlling said echo acquiring means to perform the navigator echo acquisition, and thereafter controlling said preparation means to effect the RF excitation for preparation during one of two consecutive periods, and for controlling said echo acquiring means to perform the imaging echo acquisition, and thereafter controlling said preparation means to effect the RF excitation for preparation during the other of the two consecutive periods.

In the invention of this aspect, since the RF excitation is effected on spins within an object and the navigator echo is acquired and thereafter the RF excitation for preparation is effected during one of two consecutive periods, and the RF excitation is effected on the spins within the object and the imaging echo is acquired and thereafter the RF excitation for preparation is effected during the other of the two consecutive periods, the interval from the navigator echo acquisition to the beginning of the next period is long, and the time available for the calculation on the navigator echo is long.

Therefore, the present invention can provide a magnetic resonance signal acquiring method and apparatus in which the time available for a calculation on a navigator echo is long, and a recording medium on which a program is recorded for causing a computer to perform such a magnetic resonance signal acquiring function, and a magnetic resonance imaging apparatus comprising such magnetic resonance signal acquiring means.

Further objects and advantages of the present invention will be apparent from the following description of the preferred embodiments of the invention as illustrated in the accompanying drawings.

DETAILED DESCRIPTION OF THE INVENTION

Figure 2:
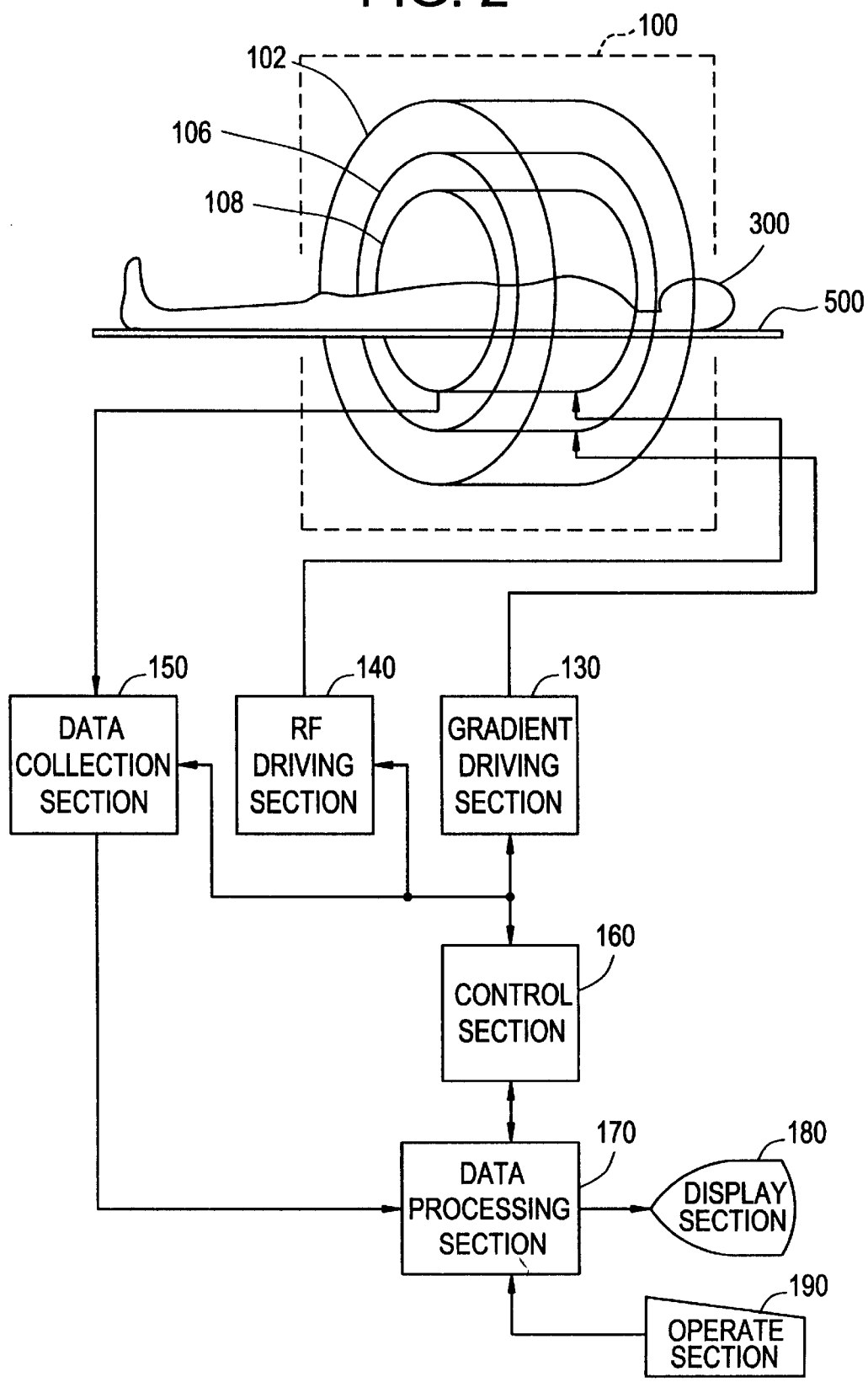
FIG. 2 is a block diagram of an apparatus in accordance with an embodiment of the present invention.

Several embodiments of the present invention will now be described in detail with reference to the accompanying drawings. FIG. 2 is a block diagram of a magnetic resonance imaging apparatus, which is an embodiment of the present invention. The configuration of the apparatus represents an embodiment of the apparatus in accordance with the present invention. The operation of the apparatus represents an embodiment of the method in accordance with the present invention.

As shown in FIG. 2, the present apparatus has a magnet system 100. The magnet system 100 has a main magnetic field coil section 102, a gradient coil section 106 and an RF (radio frequency) coil section 108. These coil sections have a generally cylindrical shape and are concentrically disposed. An object to be imaged 300 is rested on a cradle 500 and carried into and out of the generally cylindrical internal space (bore) of the magnet system 100 by carrier means, which is not shown.

The main magnetic field coil section 102 generates a static magnetic field in the internal space of the magnet system 100. The direction of the static magnetic field is generally in parallel with the direction of the body axis of the object 300. That is, a "horizontal" magnetic field is generated. The main magnetic field coil section 102 is made using a superconductive coil, for example. It will be easily recognized that the main magnetic field coil section 102 is not limited to the superconductive coil, but may be made using a normal conductive coil or the like.

The gradient coil section 106 generates gradient magnetic fields for imparting gradients to the static magnetic field strength. The gradient magnetic fields to be generated are the following three: a slice gradient magnetic field, a phase encoding gradient magnetic field and a readout gradient magnetic field. The gradient coil section 106 has three gradient coils, which are not shown, corresponding to these three gradient magnetic fields. A gradient magnetic field will sometimes be referred to simply as a gradient hereinbelow. The three gradient magnetic fields impart respective gradients to the static magnetic field strength in three mutually orthogonal directions.

The RF coil section 108 generates a high frequency magnetic field for exciting spins within the object 300 in the static magnetic field space. The generation of the high frequency magnetic field will sometimes be referred to as transmission of an RF excitation signal hereinbelow. The RF coil section 108 also receives electromagnetic waves, i.e., magnetic resonance signals, generated by the excited spins.

The RF coil section 108 has transmission and receive coils, which are not shown. For the transmission and receive coils, the same coil or separate dedicated coils may be used.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF excitation signal, thereby exciting the spins within the object 300.

The RF coil section 108 is connected with a data collecting section 150. The data collecting section 150 gathers receive signals received by the RF coil section 108 and collects the signals as digital data.

The received signals include two types, i.e., a navigator echo and an imaging echo, and the respective data for the echoes are collected. The data concerning the navigator echo will be sometimes referred to simply as a navigator echo, and the data concerning the imaging echo will be sometimes referred to simply as an imaging echo hereinbelow.

The gradient driving section 130, RF driving section 140 and data collecting section 150 are connected with a control section 160. The control section 160 controls the gradient driving section 130, RF driving section 140 and data collecting section 150 to carry out imaging. The control section 160 also adjusts the frequency of the output signal from the RF driving section 140, i.e., the RF excitation frequency.

The control section 160 is, for example, constituted using a computer. The control section 160 has a memory, which is not shown. The memory stores programs for the control section 160 and several kinds of data. The function of the control section 160 is achieved by the computer executing a program stored in the memory.

The output of the data collecting section 150 is connected to a data processing section 170. The data collected by the data collecting section 150 is input to the data processing section 170. The data processing section 170 is, for example, constituted using a computer. The data processing section 170 has a memory, which is not shown. The memory stores programs for the data processing section 170, and several kinds of data. The function of the present apparatus is achieved by the data processing section 170 executing a program stored in the memory.

A portion consisting of the magnet system 100, gradient driving section 130, RF driving section 140, data collecting section 150, control section 160 and data processing section 170 is an embodiment of the magnetic resonance signal acquiring apparatus of the present invention. The configuration of the apparatus represents an embodiment of the apparatus in accordance with the present invention. The operation of the apparatus represents an embodiment of the method in accordance with the present invention.

The data processing section 170 stores the navigator echo and imaging echo input from the data collecting section 150 into the memory. A data space for storing the imaging echo is formed in the memory. The data space constitutes a two-dimensional Fourier space. The data processing section 170 performs a two-dimensional inverse Fourier transformation on the data in the two-dimensional Fourier space to produce (reconstruct) an image of the object 300. The two-dimensional Fourier space will be sometimes referred to as a k-space hereinbelow. The data processing section 170 performs a calculation based on the navigator echo input from the data collecting section 150. The frequency and phase of spins are obtained from the calculation.

The data processing section 170 is connected to the control section 160. The data processing section 170 is above the control section 160 and controls it. The frequency and phase of spins obtained from the calculation based on the navigator echo are input to the control section 160 as information for adjusting the frequency of the RF excitation signal.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and the section 190 inputs several commands, information and so forth to the data processing section 170. The user interactively operates the present apparatus via the display section 180 and operating section 190.

Figure 3:
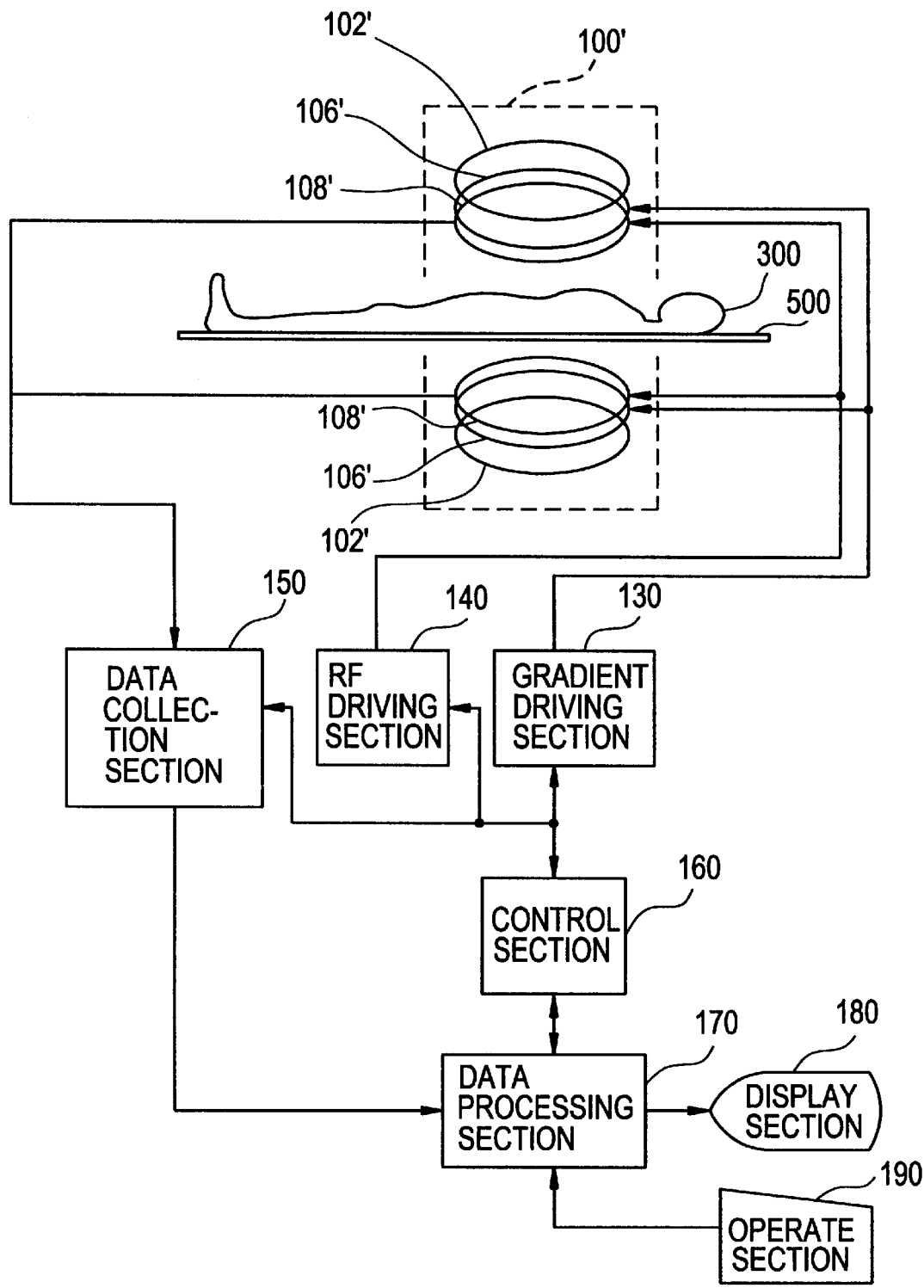
FIG. 3 is a block diagram of an apparatus in accordance with an embodiment of the present invention.

FIG. 3 is a block diagram of a magnetic resonance imaging apparatus of another type, which is another embodiment of the present invention. The configuration of the apparatus represents an embodiment of the apparatus in accordance with the present invention. The operation of the apparatus represents an embodiment of the method in accordance with the present invention.

The apparatus shown in FIG. 3 has a magnet system 100' of a type different from that in the apparatus shown in FIG. 2. Since the apparatus has a configuration similar to that of the apparatus shown in FIG. 1, except for the magnet system 100', similar portions are designated by similar reference numerals and the explanation thereof will be omitted.

The magnet system 100' has a main magnetic field magnet section 102', a gradient coil section 106' and an RF coil section 108'. The main magnetic field magnet section 102' and the coil sections each consists of a pair of members facing each other across a space. These sections have a generally disk-like shape and are disposed to have a common center axis. The object 300 is rested on the cradle 500 and carried into and out of the internal space (bore) of the magnet system 100' by carrier means, which is not shown.

The main magnetic field magnet section 102' generates a static magnetic field in the internal space of the magnet system 100'. The direction of the static magnetic field is generally orthogonal to the direction of the body axis of the object 300. That is, a "vertical" magnetic field is generated. The main magnetic field magnet section 102' is made using a permanent magnet, for example. It will be easily recognized that the main magnetic field magnet section 102' is not limited to a permanent magnet, but may be made using a super or normal conductive electromagnet or the like.

The gradient coil section 106' generates gradient magnetic fields for imparting gradients to the static magnetic field strength. The gradient magnetic fields to be generated are the following three: a slice gradient magnetic field, a readout gradient magnetic field and a phase encoding gradient magnetic field. The gradient coil section 106' has three gradient coils, which are not shown, corresponding to these three gradient magnetic fields.

The RF coil section 108' transmits an RF excitation signal for exciting spins within the object 300 in the static magnetic field space. The RF coil section 108' also receives magnetic resonance signals generated by the excited spins.

The RF coil section 108' has transmission and receive coils, which are not shown. For the transmission and receive coils, the same coil or separate dedicated coils may be used.

A portion consisting of the magnet system 100', gradient driving section 130, RF driving section 140, data collecting section 150, control section 160 and data processing section 170 is an embodiment of the magnetic resonance signal acquiring apparatus of the present invention. The configuration of the apparatus represents an embodiment of the apparatus in accordance with the present invention. The operation of the apparatus represents an embodiment of the method in accordance with the present invention.

Figure 4:
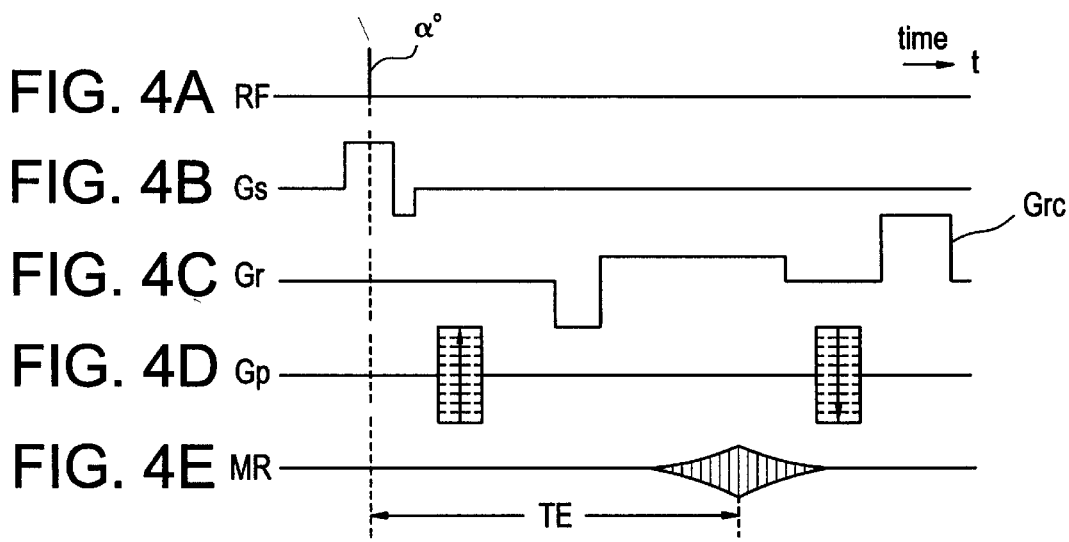
FIG. 4 is a diagram illustrating an exemplary pulse sequence executed by the apparatus shown in FIG. 2 or 3.

FIG. 4 illustrates an exemplary pulse sequence for the imaging echo acquisition executed by the apparatus shown in FIG. 2 or 3. The pulse sequence is one for acquiring a gradient echo as the imaging echo.

Specifically, (1) is a sequence of an $\alpha°$ pulse for RF excitation, and (2), (3), (4) and (5) are sequences of a slice gradient Gs, a readout gradient Gr, a phase encoding gradient Gp and a gradient echo MR, respectively. It should be noted that the α° pulse is represented by its central signal. The pulse sequence proceeds from the left to the right along a time axis t.

As shown, the α° pulse effects α° excitation of the spins, wherein α is not greater than 90. At the same time, the slice gradient Gs is applied to achieve selective excitation for a certain slice.

After the α° excitation, the spins are phase-encoded by the phase encoding gradient Gp. Next, the spins are first dephased and are subsequently rephased by the readout gradient Gr to generate a gradient echo MR. The gradient echo MR is an RF signal having a waveform symmetric with respect to an echo center. The central echo occurs after TE (echo time) from the α° excitation. The gradient echo MR is the imaging echo.

The gradient echo MR is collected as view data by the data collecting section 150. After the data collection, the phase encoding gradient Gp is applied in a direction opposite to the aforementioned one to effect "rewind" for bringing the phase encoding back to zero. Moreover, the readout gradient Grc is applied to dephase the spins. The readout gradient is a so-called "crusher".

Such a pulse sequence is repeated 64–256 times. The phase encoding gradient Gp is varied for each repetition to provide different phase encoding each time. Thus, view data for 64–256 views are obtained in the k-space.

The view data obtained by the pulse sequence of FIG. 4 is collected into the memory in the data processing section 170. The data processing section 170 performs a two-dimensional inverse Fourier transformation on the view data to reconstruct a tomographic image of the object 300.

Figure 5:
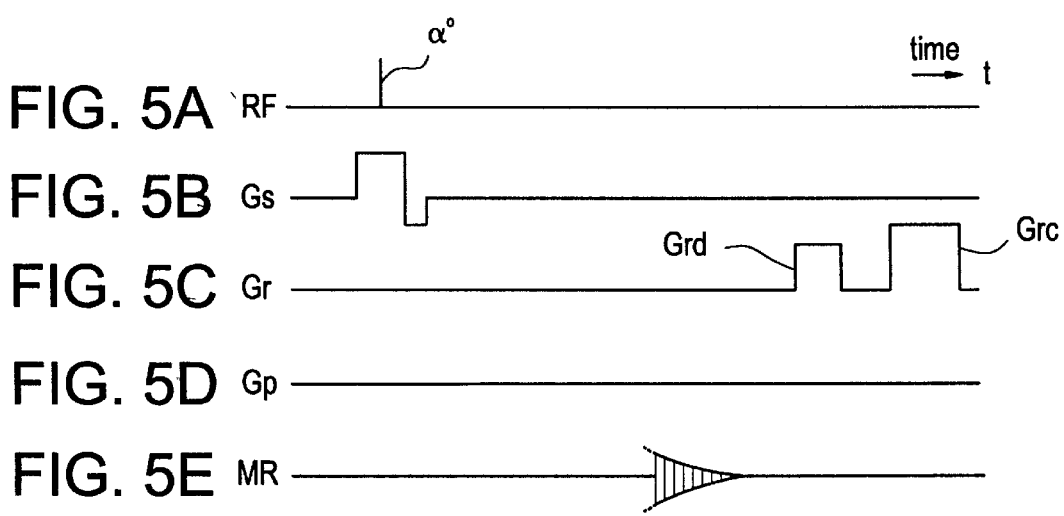
FIG. 5 is a diagram illustrating an exemplary pulse sequence executed by the apparatus shown in FIG. 2 or 3.

FIG. 5 illustrates an exemplary pulse sequence for the navigator echo acquisition executed by the apparatus shown in FIG. 2 or 3. (1) is a sequence of an α° pulse for RF excitation, and (2), (3), (4) and (5) are sequences of a slice gradient Gs, a readout gradient Gr, a phase encoding gradient Gp and a navigator echo MR, respectively. It should be noted that the α° pulse is represented by its central signal. The pulse sequence proceeds from the left to the right along a time axis t.

As shown, the α° pulse effects α° excitation of the spins, wherein α° is not greater than 90. At the same time, the slice gradient Gs is applied to achieve selective excitation for a certain slice.

The navigator echo MR, i.e., an FID signal, generated by the α° excitation is collected by the data collecting section 150 over a predetermined period. The data collection period corresponds to the collection period for the imaging echo shown in FIG. 3.

After the navigator echo collection, a readout gradient Grd is applied. The readout gradient Grd has an integral value equal to that of the readout gradient Gr for generating the gradient echo shown in FIG. 4. Subsequent to the gradient, a crusher Grc is applied. No readout gradient is applied before the navigator echo collection. Moreover, no phase encoding gradient is applied throughout the period.

Such navigator echo collection is performed before the imaging echo collection, and the frequency and phase of the navigator echo is determined by a calculation based on the navigator echo to obtain data for adjustment on the frequency of RF excitation, or α° excitation, for generating the imaging echo.

When preparation such as spatial pre-saturation, chemical saturation, magnetization transfer or inversion is to be performed before collecting the imaging echo, the imaging echo acquiring pulse sequence and the navigator echo acquiring pulse sequence respectively shown in FIGS. 4 and 5 are provided with respective preparatory RF excitation sequences.

Figure 6:
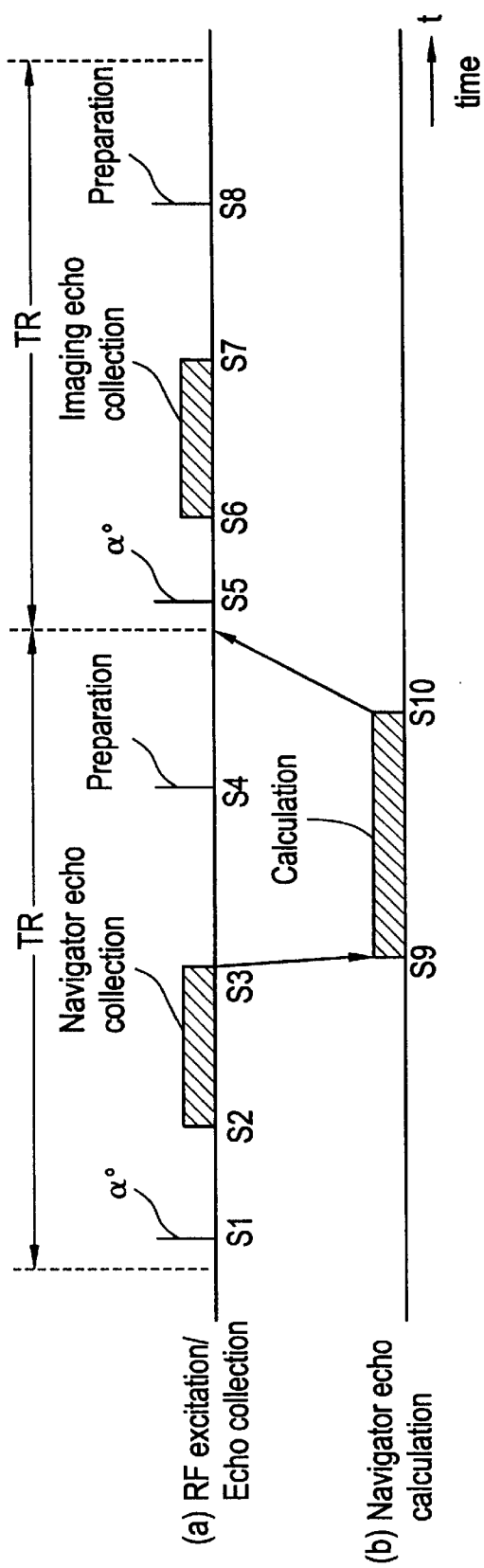
FIG. 6 is a time chart of the operation of the apparatus shown in FIG. 2 or 3.

FIG. 6(a) schematically shows an exemplary time chart of the imaging echo acquisition and navigator echo acquisition provided with the preparatory RF excitation sequence.

As shown, during one of two consecutive periods TR, α° excitation is effected at a time s1, a navigator echo is collected from a time s2 to a time s3, and thereafter, RF excitation for preparation is effected at a time s4. The α° excitation and navigator echo collection is achieved by the pulse sequence shown in FIG. 5. In the RF excitation for preparation, a slice gradient for selective excitation, for example, is applied as required, which is omitted in the drawing.

The magnet system 100 (100'), gradient driving section 130, RF driving section 140 and data collecting section 150 involved in the α° excitation and navigator echo collection constitute an embodiment of the echo acquiring means of the present invention.

The magnet system 100 (100'), gradient driving section 130 and RF driving section 140 involved in the RF excitation for preparation constitute an embodiment of the preparation means of the present invention.

During the other of the periods, α° excitation is effected at a time s5, an imaging echo is collected from a time s6 to a time s7, and thereafter, RF excitation for preparation is effected at a time s7. The α° excitation and imaging echo collection is achieved by the pulse sequence shown in FIG. 4. In the RF excitation for preparation, a slice gradient for selective excitation, for example, is applied as required, which is omitted in the drawing.

The magnet system 100 (100'), gradient driving section 130, RF driving section 140 and data collecting section 150 involved in the α° excitation and imaging echo collection constitute an embodiment of the echo acquiring means of the present invention.

The magnet system 100 (100'), gradient driving section 130 and RF driving section 140 involved in the RF excitation for preparation constitute an embodiment of the preparation means of the present invention.

With such two periods as a unit, the navigator and imaging echo acquisition is repeated for, for example, 64–512 times. Thus, the preparation after the navigator echo collection serves as preparation for the imaging echo acquisition in the subsequent period, and the preparation after the imaging echo collection serves as preparation for the navigator echo acquisition in the subsequent period.

Instead of performing the navigator echo acquisition before each imaging echo acquisition, the navigator echo acquisition may be performed at a less frequent rate of occurrence than the imaging echo acquisition, such as by performing navigator echo acquisition in one period followed by imaging echo acquisition over a plurality of consecutive periods. Again in this case, preparation applied in the earlier period serves as the preparation for the imaging echo acquisition or navigator acquisition in the later period in the same way.

After the navigator echo collection, a calculation based on the collected navigator echo is performed from a time s9 to a time s10, as shown in FIG. 6(b), to evaluate the frequency and phase of the navigator echo. The data processing section 170 involved in the calculation is an embodiment of the calculating means of the present invention.

The result of the calculation is supplied from the data processing section 170 to the control section 160. The control section 160 adjusts the RF excitation frequency for the next period based on the supplied calculation result. The control section 160 involved in the frequency adjustment is an embodiment of the frequency adjusting means of the present invention.

The frequency adjustment enables $\alpha°$ excitation and RF excitation for preparation in agreement with the current value of the spin frequency to be effected in the next period. It should be noted that the frequency for the $\alpha°$ excitation and RF excitation for preparation in the first period is adjusted to a suitable value beforehand by the tuning performed before commencing imaging.

As described above, during each period, $\alpha°$ excitation is initially effected and a navigator echo or an imaging echo is collected, and thereafter, RF excitation for preparation is effected for the next period. Control of such timing is conducted by the control section 160. The control section 160 involved in the timing control is an embodiment of the control means of the present invention.

Figure 1:
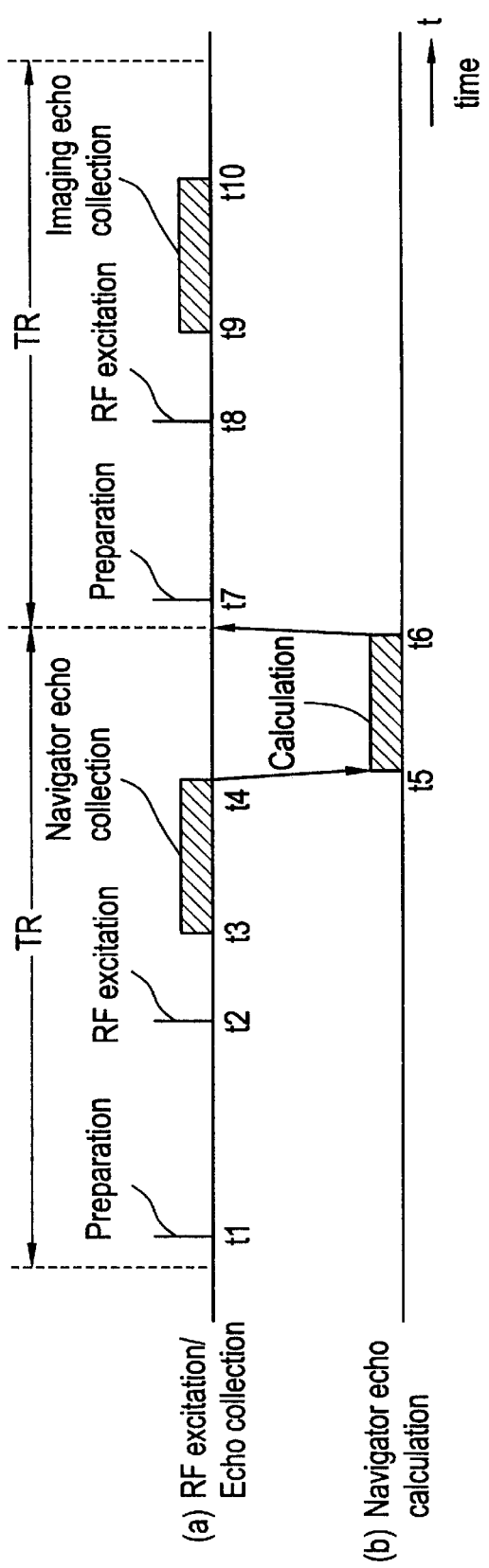
FIG. 1 is a time chart of the operation of a conventional apparatus.

In the present apparatus, such timing control as described above causes an interval from the end of the navigator echo collection to the beginning of the next period to be extended as compared with the conventional technique shown in FIG. 1. Therefore, the time available for performing a calculation on the navigator echo is increased. Thus, the calculation can be completed within the interval without particularly speeding up the calculation. Moreover, the period TR does not need to be extended, or can be even reduced in some cases.

A program for causing a computer to perform the magnetic resonance signal acquiring function as described above is recorded on a recording medium in a computer-readable manner. For the recording medium, any one of, for example, a magnetic recording medium, an optical recording medium, a magneto-optical recording medium and other appropriate types of recording medium can be employed. The recording medium may be a semiconductor storage medium. A storage medium is synonymous with a recording medium in the present specification.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance signal acquiring method comprising the steps of:
   applying an RF excitation to excite spins of protons within an object;
   thereafter obtaining a free induction decay signal of said spins;
   performing a calculation on said free induction decay signal;
   applying resulting calculation to said RF excitation to thereby obtain a frequency adjusted calculated RF excitation;
   applying, during one of two consecutive periods, an RF preparation signal to bring said spins to a predetermined state;
   applying said calculated RF excitation to excite spins of protons within said object;
   thereafter obtaining an imaging echo of said spins obtained by exciting said spins using said calculated RF excitation; and
   applying, during the other of said two consecutive periods, another RF preparation signal to bring the spins to another predetermined state.

2. The method of claim 1, wherein said RF preparation signal provides spatial pre-saturation.

3. The method of claim 1, wherein said RF preparation signal provides chemical saturation.

4. The method of claim 1, wherein said RF preparation signal provides magnetization transfer.

5. The method of claim 1, wherein said RF preparation signal is an inverted signal.

6. A magnetic resonance signal acquiring apparatus for acquiring magnetic resonance signals from an object using a static magnetic field, a gradient magnetic field, and a high frequency magnetic field, said apparatus comprising:
   means for applying an RF excitation to excite spins of protons within an object;
   means for thereafter obtaining a free induction decay signal of said spins;
   means for performing a calculation on said free induction decay signal;
   means for applying resulting calculation to said RF excitation to thereby obtain a frequency adjusted calculated RF excitation;
   means for applying, during one of two consecutive periods, an RF preparation signal to bring said spins to a predetermined state;
   means for applying said calculated RF excitation to excite spins of protons within said subject;
   means for thereafter obtaining an imaging echo of said spins obtained by exciting said spins using said calculated RF excitation; and
   means for applying, during the other of said two consecutive periods, another RF preparation signal to bring the spins to another predetermined state.

7. The apparatus of claim 6, wherein said RF preparation signal provides spatial pre-saturation.

8. The apparatus of claim 6, wherein said RF preparation signal provides chemical saturation.

9. The apparatus of claim 6, wherein said RF preparation signal provides magnetization transfer.

10. The apparatus of claim 6, wherein said RF preparation signal is inverted.

11. A recording medium that is recorded in a computer-readable manner with a program for causing a computer to execute the functions of:
   applying an RF excitation to excite spins of protons with an object;
   thereafter obtaining a free induction decay signal of said spins;
   performing a calculation on said free induction decay signal;
   applying a resulting calculation to said RF excitation to thereby obtain a frequency adjusted calculated RF excitation;
   applying, during one of two consecutive periods, an RF preparation signal to bring said spins to a predetermined state;
   applying said calculated RF excitation to excite spins of protons within said object;
   thereafter obtaining an imaging echo of said spins obtained by exciting said spins using said calculated RF excitation; and
   applying, during the other of said two consecutive periods, another RF preparation signal to bring the spins to another predetermined state.

12. The recording medium of claim 11, wherein said RF preparation signal provides spatial pre-saturation.

13. The recording medium of claim 11, wherein said RF preparation signal provides chemical saturation.

14. The recording medium of claim 11, wherein said RF preparation signal provides magnetization transfer.

15. The recording medium of claim 11, wherein said RF preparation signal is inverted.

16. A magnetic resonance imaging apparatus for acquiring magnetic resonance signals from an object using a static magnetic field, a gradient magnetic field, and a high frequency magnetic field, and constructing an image based on said acquired magnetic resonance signals, wherein said apparatus comprises:

preparation means for applying RF preparation signals to excite spins of protons within an object;

echo acquiring means for effecting RF excitation of said spins and for acquiring a free induction decay signal thereof, and for effecting RF excitation of said spins and for acquiring an imaging echo thereof;

calculating means for performing calculations on said free induction decay signals;

frequency adjusting means for adjusting frequency of said RF excitation based on results of said calculation; and control means for controlling said echo acquiring means to acquire said free induction decay signals, and for controlling said preparation means to effect application of said RF preparation signal during one of two consecutive periods, and for controlling said echo acquiring means to perform imaging echo acquisition, and for controlling said preparation means to apply said RF preparation signal during the other of said two consecutive periods.

17. The apparatus of claim 16, wherein said preparation means comprises means for providing spatial pre-saturation.

18. The apparatus of claim 16, wherein said preparation means comprises means for providing chemical saturation.

19. The apparatus of claim 16, wherein said preparation means comprises means for providing magnetization transfer.

20. The apparatus of claim 16, wherein said preparation means comprises means for providing inversion of said RF preparation signal.

* * * * *